United States Patent
Sakuragi

[11] Patent Number: 5,885,345
[45] Date of Patent: Mar. 23, 1999

[54] METHOD OF FABRICATING SHAPED CRYSTALS BY OVERHEAD-PRESSURE LIQUID INJECTION

[75] Inventor: Shiro Sakuragi, Ibaraki-ken, Japan

[73] Assignee: Union Material Inc., Ibaraki, Japan

[21] Appl. No.: 817,873

[22] PCT Filed: Jul. 30, 1996

[86] PCT No.: PCT/FR95/01278

§ 371 Date: May 21, 1997

§ 102(e) Date: May 21, 1997

[87] PCT Pub. No.: WO97/13010

PCT Pub. Date: Apr. 10, 1997

[30] Foreign Application Priority Data

Sep. 29, 1995 [JP] Japan ..................................... 7-276751
Dec. 26, 1995 [JP] Japan ..................................... 7-351521

[51] Int. Cl.[6] .................................................. C30B 15/34
[52] U.S. Cl. ............................................. 117/16; 117/209
[58] Field of Search ................................. 117/4, 16, 23, 117/209, 223

[56] References Cited

U.S. PATENT DOCUMENTS 4,540,550  9/1985  Gaida et al. ............................. 117/208
4,610,754  9/1986  Gaida et al. ............................. 117/82

FOREIGN PATENT DOCUMENTS 51-20097   2/1976  Japan.
60-70720   4/1985  Japan.
1-115812   5/1989  Japan.
4-25872    3/1992  Japan.

OTHER PUBLICATIONS

"Modeling of high pressure, liquid–encapsulated Czochralski growth of InP crystals"; Zhang, et al.; J. Cryst. Growth (1996), pp. 250–260. (Abstract Only).

*Primary Examiner*—Felisa Hiteshew
*Attorney, Agent, or Firm*—Beveridge, DeGrandi, Weilacher & Young, LLP

[57] ABSTRACT

A shaper (2) is arranged within a shaping vessel (1). A raw material for a crystal is inserted into the shaping vessel (1) and a crystal melt (5) is formed by setting it in a predetermined atmosphere and heating it. A mechanical force F1 is applied to the crystal melt (5), which is present on the upper surface of the shaper (2), by a pressuring member (4) from above. The crystal melt (5) has nowhere to escape but a gap (3) formed by the shaper(2), so it is injected into that gap (3) as shown by the arrow. This method of fabricating a shaped crystal is suitable for fabricating a monocrystal or multicrystal semiconductor from a material such as silicon, germanium, or bismuth telluride.

9 Claims, 7 Drawing Sheets

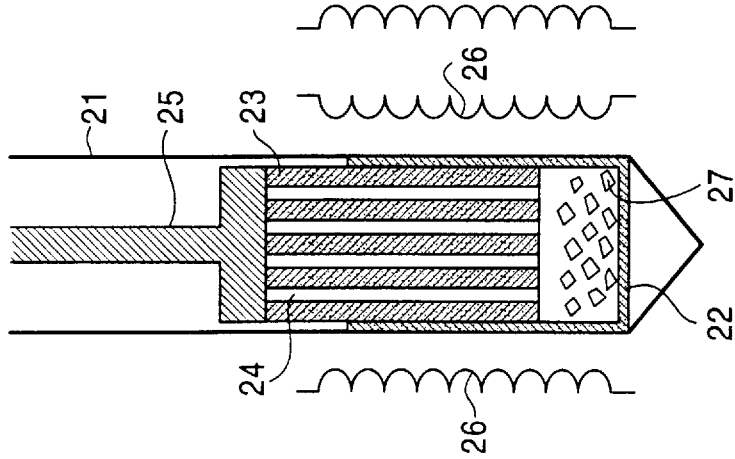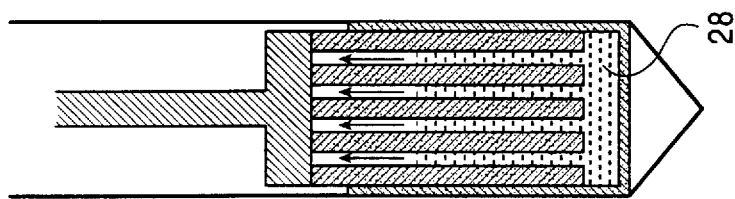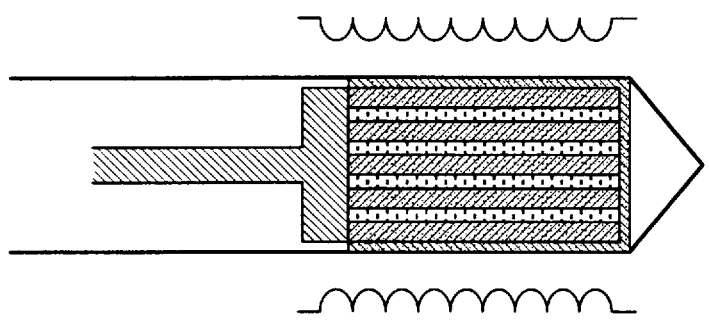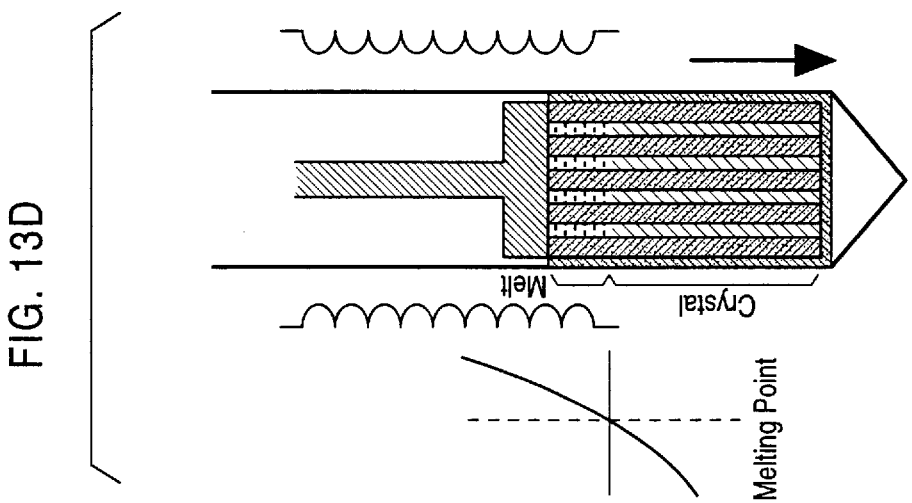

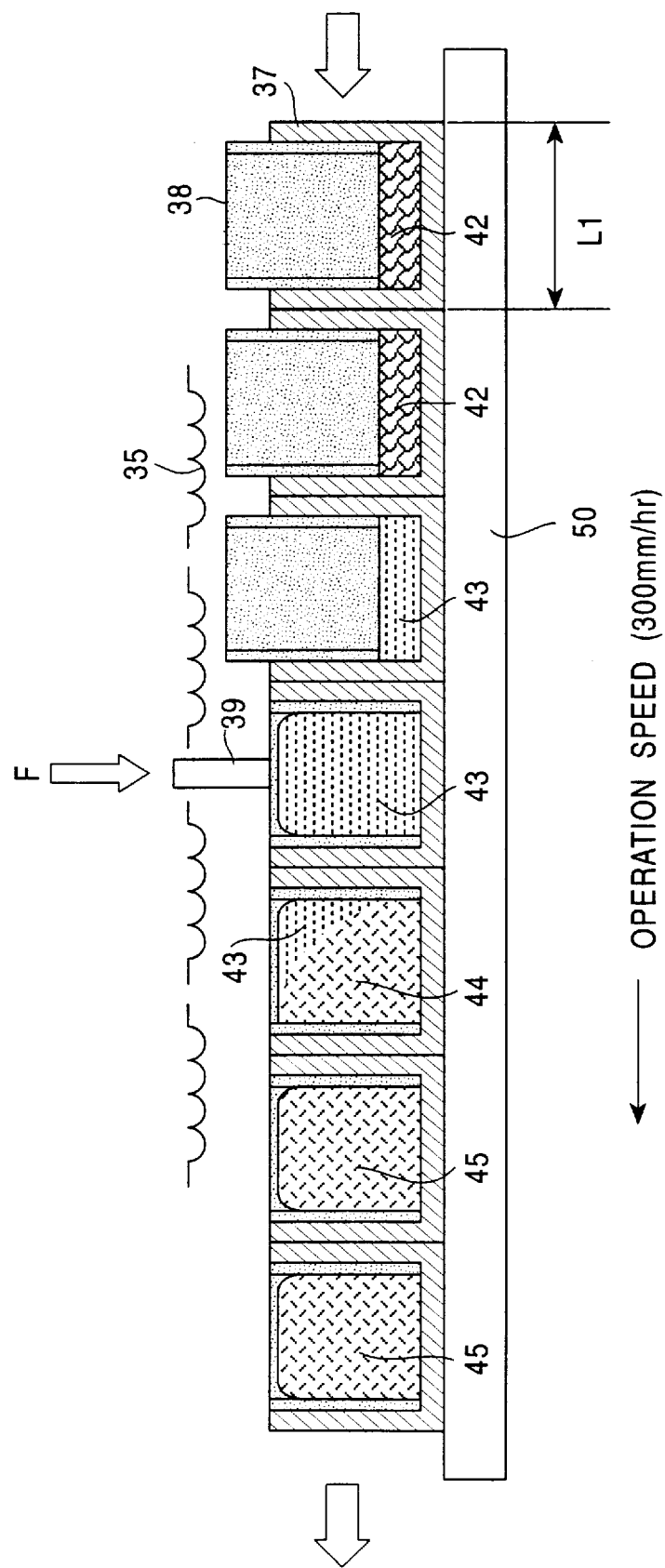

METHOD OF FABRICATING SHAPED CRYSTALS BY OVERHEAD-PRESSURE LIQUID INJECTION

TECHNICAL FIELD

The present invention relates to a method of fabricating a semiconductor monocrystal or multicrystal of a material such as silicon, germanium, or bismuth telluride, and, in particular, to a method of fabricating a semiconductor crystal that is formed to have a predetermined shape.

BACKGROUND OF ART

A method of fabricating a large number of cube-shaped monocrystal pieces with sides on the order of 1 to 3 mm is known in the prior art as a method of fabricating pieces of a semiconductor crystal, such as a monocrystal or multicrystal semiconductor of a bismuth/tellurium compound; which involves slicing an ingot of monocrystal or multicrystal grown in an a-axial direction by a downward-drawing method to form circular plates, then dicing these circular plates.

Other methods, such as Edge-defined Film-fed Growth (EFG) and crosscut methods, are also known in the prior art as methods of fabricating sheets of semiconductor crystal such as silicon ribbon crystals.

However, the above method of fabricating monocrystal or multicrystal semiconductor pieces of a bismuth/tellurium compound necessitates a cutting process of one slicing step and two dicing steps, so it is expensive.

Furthermore, the silicon melt solidifies at a speed of ten to several hundred mm/minute with the above EFG and crosscut methods, so the grain size of the completed crystals is small and thermal stresses still remain therein, and thus quality is poor.

The present invention was devised in the light of the above problems and has as an objective thereof the provision of an inexpensive method of fabricating shaped crystals of a needle shape (diameter: approximately 0.5 mm to 3 mm) or sheet shape (thickness: approximately 0.5 mm) from a high-quality bismuth/tellurium compound or other semiconductor.

DISCLOSURE OF INVENTION

This invention concerns a method of fabricating a shaped crystal by overhead-pressure liquid injection, comprising a step of heating a raw crystal material within a shaping vessel set in a predetermined atmosphere, to form a melt; a step of pressuring the melt from overhead, to inject the same into a shaper disposed within the shaping vessel; and a step of cooling the melt injected into the shaper, to form a crystal.

The melt could be injected inward from above or below the shaper. The pressuring during this time could be performed by a mechanical force or by the use of a gas pressure that is set by means for setting the atmosphere of the shaping vessel.

If the shaping vessel is formed to have a box shape and a plurality of conical holes are provided in the base of the interior thereof for controlling the orientation of crystals, it is possible to control a-axis orientation.

If the shaper is configured of a plurality of plate members, each having grooves of a predetermined shape in the vertical direction and being linked together in such a manner that the grooves are opposing, a large number of needle crystals can be fabricated simultaneously.

If the shaper is configured of a linked series of a plurality of plate members formed to have steps of predetermined dimensions along left and right edges thereof, a plurality of sheet crystals can be fabricated simultaneously.

Since the present invention can thus be used to fabricate a number of shaped crystals simultaneously, fabrication costs are reduced. The speed of growth of the crystals can also be slowed so that high-quality crystals are obtained.

BRIEF DESCRIPTION OF DRAWINGS

FIGS. 13A to 13D show the process of fabricating needle monocrystals;

FIG. 26 shows essential components of a third embodiment of this invention.

BEST MODE FOR CARRYING OUT THE INVENTION

Embodiments of this invention will be described below with reference to the accompanying drawings.

(1) Crystal Melt Injection Methods

First Method

Figure 1:
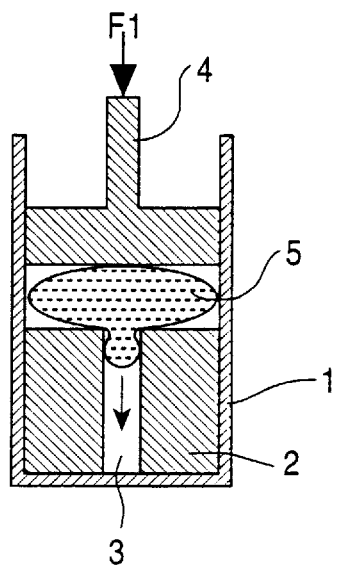
FIG. 1 shows a first example of the crystal melt injection method in accordance with this invention.

A first example of the crystal melt injection method in accordance with this invention is shown in FIG. 1. This figure is a section taken in the vertical direction. With this method, a shaper 2 is disposed within a shaping vessel 1. A crystal melt 5, which is present on an upper surface of the shaper 2, is pressed from above by a pressuring member 4. During this time, a mechanical force F1 is applied to the pressuring member 4 from above. When the crystal melt 5 is pressed by a lower edge of the pressuring member 4, it has nowhere to escape but a gap 3 formed in the shaper 2, so it is injected into the gap 3 as shown by the arrow in FIG. 1.

Note that details of the materials and configuration of the shaping vessel 1 and the shaper 2, as well as the conditions (such as temperature and atmosphere) necessary during the injection of the crystal melt and the processing before and after that injection, will be given later in the description of embodiments of the method of fabricating a shaped crystal.

Second Method

Figure 2:
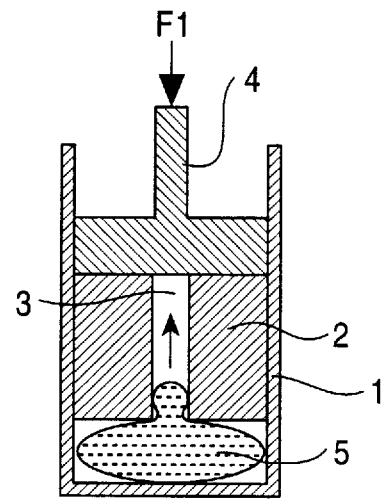
FIG. 2 shows a second example of the crystal melt injection method in accordance with this invention.

A second example of the crystal melt injection method in accordance with this invention is shown in FIG. 2. In this case, portions that are identical to those shown in FIG. 1 are denoted by the same reference numbers as those in FIG. 1. In this method, the shaper 2, which is present on the upper surface of the crystal melt 5, is pressed from above by the pressuring member 4. During this time, the mechanical force F1 is applied to the pressuring member 4 from above. When the shaper 2 is pressed by a lower edge of the pressuring member 4, it moves downward into the vessel 1. This time, the crystal melt 5 has nowhere to escape but the gap 3 formed by the shaper 2, so it is injected into the gap 3 as shown by the arrow in FIG. 2.

Third Method

Figure 3:
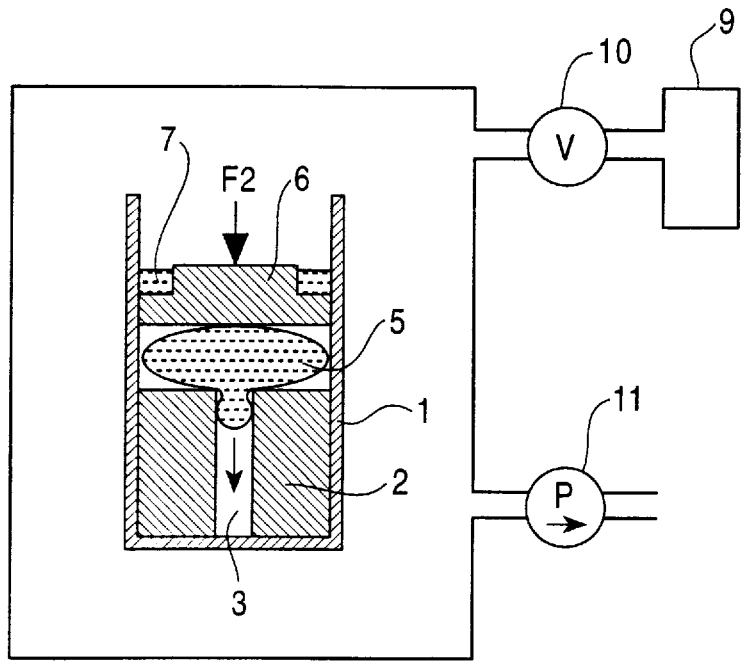
FIG. 3 shows a third example of the crystal melt injection method in accordance with this invention.

A third example of the crystal melt injection method in accordance with this invention is shown in FIG. 3. In this case, portions that are identical to those shown in FIG. 1 are denoted by the same reference numbers as those in FIG. 1. In this method, the crystal melt 5, which is present on an upper surface of the shaper 2, is pressed from above by a pressuring member 6. During this time, a gas pressure F2 is applied to the pressuring member 6. When the crystal melt 5 is pressed by a lower edge of the pressuring member 6, it has nowhere to escape but the gap 3 formed by the shaper 2, so it is injected into the gap 3 as shown by the arrow in FIG. 3.

With this method, the raw material for the crystal is first placed between the shaper 2 and the pressuring member 6, and it is also placed on top of the pressuring member 6. Next, the interior of a chamber 8 is evacuated by the operation of a vacuum pump 11. The raw material of the crystal is then melted by a heating means (not shown in the figure) provided around the shaping vessel 1. A valve 10 is opened to introduce argon gas, which is within a gas cylinder 9, into the chamber 8. Since the lower surface of the pressuring member 6 is in a vacuum, the gas pressure of the argon gas moves it to below the pressuring member 6. During this time, a part 7 of the molten raw crystal material acts to block a gap between the pressuring member 6 and an inner wall of the shaping vessel 1, so that there are no problems, even with components that have a bad machining accuracy and a lower level of airtightness.

Note that the evacuation of the atmosphere of the shaping vessel 1 by use of a vacuum pump and the melting of the raw crystal material by the heating means are the same as in the previously described first and second methods

(2) Methods of Fabricating Shaped Crystals

First Embodiment

The present embodiment is designed to inject a melt of a thermoelectric semiconductor crystal such as bismuth telluride from below into the interior of a shaper, to fabricate a large number of needle monocrystals simultaneously.

Figure 4:
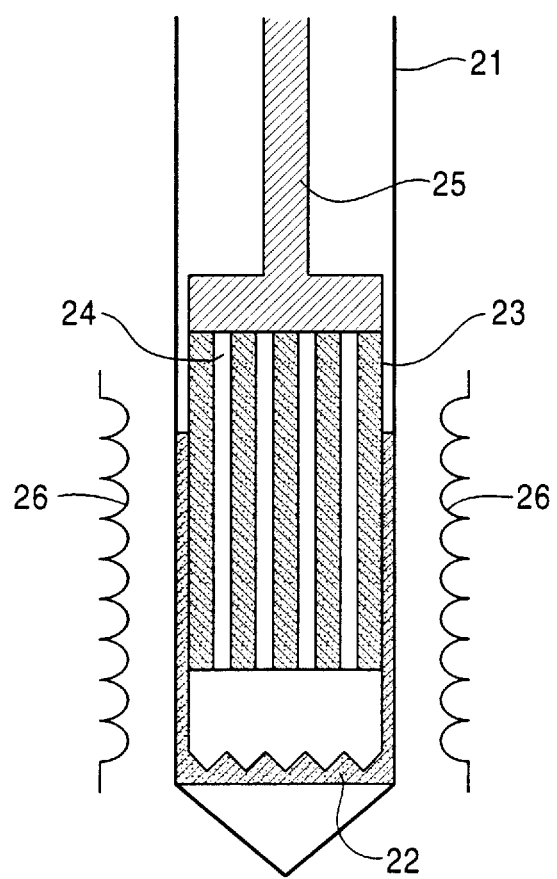
FIG. 4 shows essential components of a device for fabricating needle monocrystals of a thermoelectric compound semiconductor.

Essential components of the device for fabricating needle monocrystals of a thermoelectric compound semiconductor are shown in FIG. 4. A shaping vessel 22 is provided for accommodating the raw material for the crystal in the interior of a quartz tube 21. A shaper 23 for molding the molten raw crystal material into needle shapes is provided in the interior of the shaping vessel 22. The shaper 23 moves downward into the interior of the shaping vessel 22, pressed from above by a pressuring member 25. During this time, the melt in the base portion of the shaping vessel 22 is injected into elongated holes 24 formed in the shaper 23. In other words, this is basically equivalent to the situation shown in FIG. 2.

The temperatures and temperature gradient in the vertical direction within the quartz tube 21 are controlled by a heater 26. Note that, although this is omitted from the figures herein, portions of the heater other than those shown in FIG. 4 are provided in a metal vessel such as the chamber 8 of FIG. 3.

Figure 5:
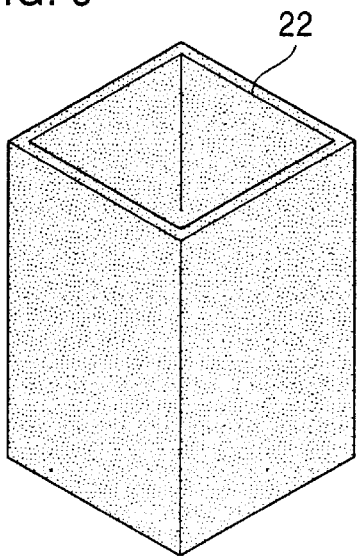
FIG. 5 is a perspective view of the shaping vessel
Figure 6:
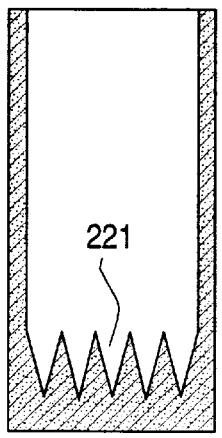
FIG. 6 is a vertical cross-sectional view of the shaping vessel.
Figure 7:
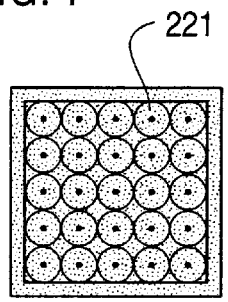
FIG. 7 is a plan view of the shaping vessel.
Figure 8:
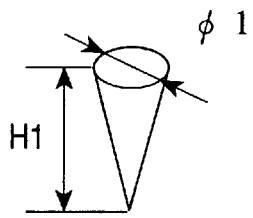
FIG. 8 shows the dimensions of a conical hole within the shaping vessel.

An example of the configuration of the shaping vessel 22 is shown in FIGS. 5 to 8. In this case, FIG. 5 is a perspective view, FIG. 6 is a vertical cross-sectional view, FIG. 7 is a plan view, and FIG. 8 shows the dimensions of a conical hole. The shaping vessel 22 is made of carbon or a ceramic such as boron nitride and is formed to have a box shape, as shown in FIG. 5 or a circular cylindrical shape. A large number (25, in these figures) of a diameter of 5 mm and a depth of 10 mm are provided in a surface of the base of the interior of the shaping vessel 22, as shown in FIGS. 6 to 8.

Figure 9:
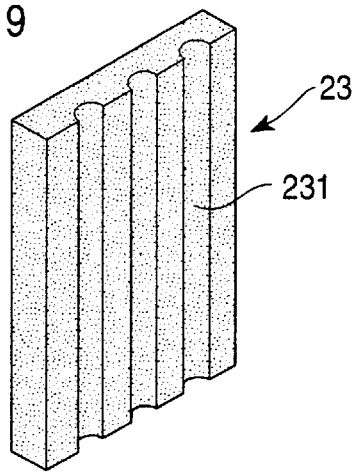
FIG. 9 is a perspective view of a shaper.
Figure 10:
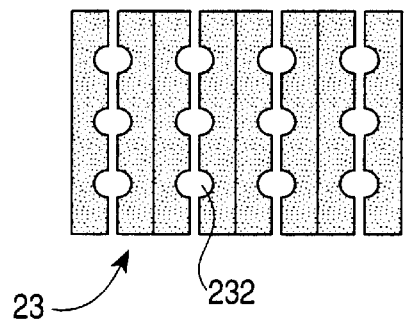
FIG. 10 is a plan view of the shaper shown in FIG. 9.
Figure 11:
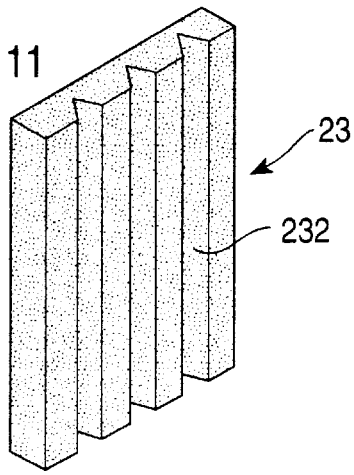
FIG. 11 is a perspective view of a shaper.
Figure 12:
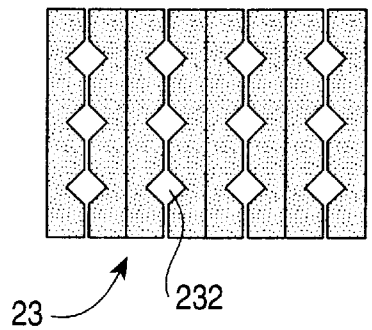
FIG. 12 is a plan view of the shaper shown in FIG. 11.

Examples of the configuration of the shaper 23 are shown in FIGS. 9 to 12. In this case, FIGS. 9 and 11 are perspective views of shapers and FIGS. 10 and 12 are plan views corresponding to FIGS. 9 and 11, respectively. In the example shown in FIGS. 9 and 10, three curved grooves 231 of a semi-circular section are cut in the vertical direction of a plate member, and two plate members are superimposed so that the curved grooves 231 are opposing (to make the relationship between the two members easier to understand, they are separated slightly in FIG. 10). A plurality of these superimposed members are themselves superimposed. This configuration enables easy removal of needle monocrystals formed therein, by mutual separation of the plate members.

In FIG. 10, curved grooves could be cut into both sides of each plate member, apart from the two edges thereof. The shape of the grooves could also be triangular or square. FIGS. 11 and 12 show a configuration in which angular grooves 232 of a triangular section-shaped are cut. In essentials, the shape and dimensions of the grooves can be determined by the shape and dimensions of the needle crystals to be fabricated.

Note that, although three grooves are shown cut into each plate member 23 in this case, it should be obvious that five grooves could be cut therein as necessary, to correspond to FIGS. 6 and 7. It is similarly obvious that five pairs of plate members (i.e. ten plates) could be inserted into the shaping vessel 22.

The crystal axis that brings out the characteristics of a bismuth/tellurium compound thermoelectric material the best is that in the a-axial direction. It is therefore preferable to grow crystal in such a manner that the a-axis is orientated in the longitudinal direction of the needle crystals. That is why a large number of the conical holes 221 is provided in the lower surface within the shaping vessel 22 of this embodiment, as previously described. It has been verified that, if the thus-configured shaping vessel is used, the action of the conical holes 221 ensures that virtually all of the crystal forms in an orientation close to the a-axis in the direction of the grooves 231 or 232.

The reason why the conical holes 221 induce this a-axis orientation is thought to be as described below. Crystallization of the bismuth telluride melt in the base portion of the shaping vessel 22 starts from the points of the conical holes 221. The start point of this crystallization is the sharp tip of each cone, and, in this case, seed-crystallization that is self-orientated along the a-axis of the tiny crystal occurs, so the growth moves gradually toward the upper part of that conical hole 221.

A method of promoting monocrystallization by sharpening a tip portion for crystallization into a conical shape has long been known among the methods of growing crystals by using a vessel, but there are no known examples in which a large quantity of needle monocrystals are crystallized from a large number of seed crystals, as in this embodiment.

Since the shaper 23 is in direct contact with the bismuth telluride melt, mutual wetting and reactions therebetween would cause the needle monocrystals to attach to the shaper after the crystallization, making removal impossible. It is therefore important to select the material of the shaper 23 and the method of use thereof. In this embodiment, a graphite object ET-10P, made by Ibiden Co., Ltd., is used as the material of the shaper 23. Since the surfaces of the curved grooves 231 or angular grooves 232 of the shaper 23 are subjected to a surface treatment by coating with a solid lubricating agent, it has been confirmed that there is absolutely no adhesion between the groove portions and the needle crystals and the needle crystals can be removed in a simple manner from the shaper 23. The solid lubricating agent used in this case is a boron nitride paint (trade name: Whitey Paint) made by Audek.

The process of fabricating needle monocrystals will next be described with reference to FIGS. 13a to 13d. Note that the conical holes 221 provided in the interior of the shaping vessel 22 are omitted from this figure, for convenience.

First of all, as shown in FIG. 13a, a raw material 27 for fabricating the thermoelectric compound semiconductor monocrystal is placed in the base portion of the shaping vessel 22, a vacuum pump (not shown in the figure) and the heater 26 are operated to remove any impurities from the surfaces of the raw material and any water vapor or oxygen from within the shaping vessel 22, then the raw material 27 is melted while an inert atmosphere that will prevent chemical bonding between the crystal and the shaper 23 is created within the shaping vessel 22.

When the raw material 27 has melted, an external force F, such as gas pressure, is applied to the pressuring member 25 to move the resultant melt 28 in the direction of the shaper 23, as shown in FIG. 13b. During this time, the melt 28 is injected into the elongated holes 24 formed by the grooves of the shaper 23.

The shaper 23 is moved as far as the base of the shaping vessel 22, as shown in FIG. 13c, and, once the melt 28 has completely filled the elongated holes 24 of the shaper 23, the quartz tube 21 is gradually moved downward, as shown in FIG. 13d, to cause the melt 28 filling the elongated holes 24 of the shaper 23 to solidify from below. During this time, the temperature gradient in the vertical direction within the quartz tube 21 (which is on the order of 20° to 40° C./cm for a bismuth/tellurium compound, for example) controls the crystal axis direction to grow in the a-axis direction, due to the provision of conical holes in the lower surface. Note that, instead of lowering the quartz tube 21 in this case, the temperature of the heater 26 could equally well be controlled to cool and solidify the crystals.

Once the melt 28 has solidified and the crystals have formed, the shaper 23 is removed from the shaping vessel 22 and a large number of needle monocrystals are removed from the elongated holes 24. In this case, needle multicrystals could also be fabricated by cooling the melt 28 quickly.

When the thus fabricated needle crystals of bismuth/tellurium compound are machined into pieces, a single cutting step alone is sufficient, enabling a huge reduction in the number of steps in comparison with the prior-art technique that requires one slicing step and two cutting steps 4a total of three steps.

Second Embodiment

In this embodiment, the crystal melt of germanium is injected into the shaper from above, to fabricate a large number of sheet crystals simultaneously.

Figure 14:
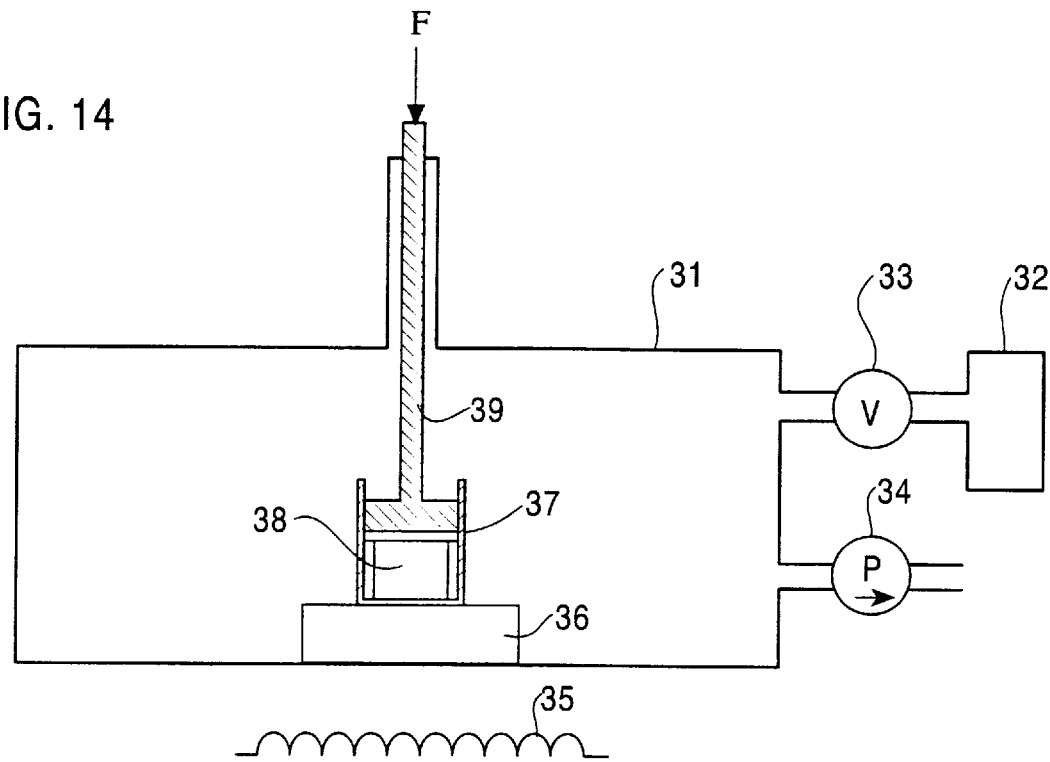
FIG. 14 shows essential components of a device for fabricating sheet monocrystals of germanium.

A gas cylinder 32 filled with argon gas is connected to a quartz tube 31, as shown in FIG. 14, and this argon gas can be introduced into the quartz tube 31 by opening a valve 33. A vacuum pump 34 is also connected to the quartz tube 31 and the interior of the quartz tube 31 can be evacuated by the operation thereof. A heater 35 is provided around the quartz tube 31 (in this figure, it is only shown below it), and the interior of the quartz tube 31 can be held at a predetermined temperature thereby. A stand 36 is disposed on a base portion within the quartz tube 31 and a shaping vessel 37 containing a raw crystal material is disposed on this stand 36. A shaper 38 for shaping the molten raw crystal material into sheets is provided within the shaping vessel 37.

Figure 15:
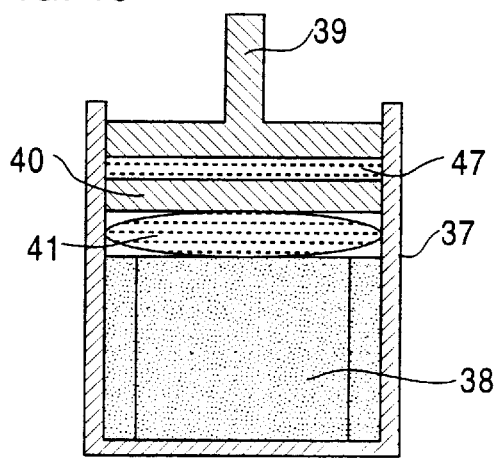
FIG. 15 shows a detail of the interior of a shaping vessel when a raw crystal material of germanium is in a molten state.

The interior of the shaping vessel 37 is shown in detail in FIG. 15, in a state in which a raw germanium crystal material is molten. The shaper 38 is placed in a base portion of the interior of the shaping vessel 37. A melt 41 of the germanium crystal is above the shaper 38. A pressuring plate 40 is disposed above the melt 41 of the germanium crystal, a material 47 such as lithium fluoride or potassium chloride is disposed thereabove, and a pressuring member 39 is disposed above that. In other words, it should be obvious that this configuration is basically equivalent to that of FIG. 1, except that the melt is disposed about the shaper as shown in FIG. 2.

The shaping vessel 37 is formed in a box shape of carbon or a ceramic such as boron nitride, in the same manner as in the first embodiment. The shaper 38 is of graphite, also in the same manner as in the first embodiment. The melting point of the lithium fluoride 47 is 842° C., less than the melting point of germanium which is 937° C. Therefore, when the germanium crystal melts, the lithium fluoride 47 also melts and acts to seal the gap between the inner wall of the shaping vessel 37 and the pressuring plate 40. It is therefore possible to use a shaping vessel 37 and pressuring plate 40 with a poor machining accuracy and low level of airtightness.

Figure 16:
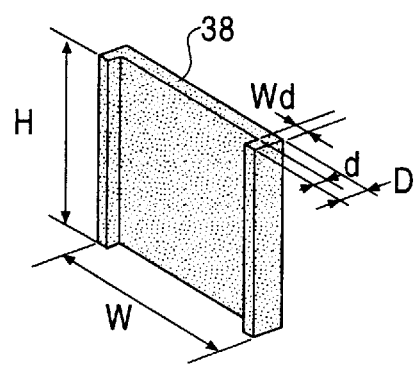
FIG. 16 is a perspective view of the shaper.
Figure 17:
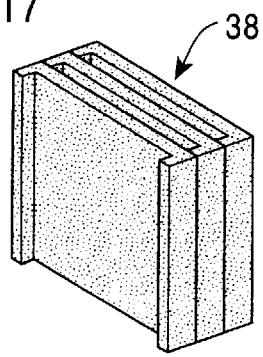
FIG. 17 is another perspective view of the shaper.

Perspective views of the shaper 38 are shown in FIGS. 16 and 17. As shown in these figures, the shaper 38 consists of plates having dimensions of a width W, a height H, and a depth D, each with a step of width Wd, height H, and depth d on each of the left and right edges thereof. A large number (e.g. 150) of the shapers shown in FIG. 16 are disposed in a linked series within the shaping vessel 37 shown in FIG. 15. Thin gaps of a width (W-2Wd), a height H, and a depth (D-d) are thus formed between neighboring shapers. The state of three linked shapers is shown in FIG. 17. The melt 41 shown in FIG. 15 is injected into these gaps, and is cooled to form sheet crystals. Therefore the various dimensions of the shaper 38 can be determined in accordance with the dimensions and thickness of the sheet crystals to be fabricated.

The description now turns to the process of fabricating germanium monocrystal sheets.

Figure 18:
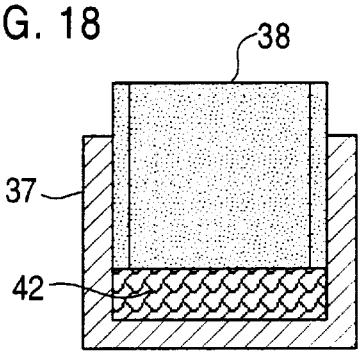
FIG. 18 is a view showing the shaper as seen from a front surface thereof, in a state in which raw crystal material is present in the base within the shaping vessel.
Figure 19:
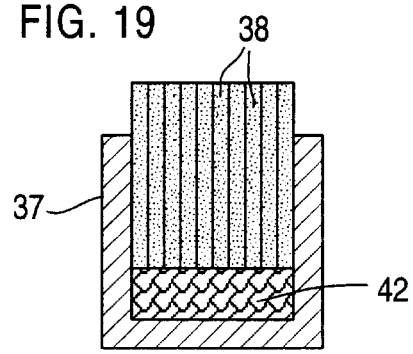
FIG. 19 is a view showing the shaper as seen from a side surface thereof, in a state in which raw crystal material is present in the base within the shaping vessel.

First of all, a raw material 42 for the fabrication of germanium crystals is placed in a base portion of the shaping vessel 37, as shown in FIGS. 18 and 19, the vacuum pump 34 and heater 35 shown in FIG. 14 are operated to remove any water vapor or oxygen from within the shaping vessel 37, then the raw material 42 is melted while an inert atmosphere that will prevent chemical bonding between the crystal and the shaper 38 is created within the shaping vessel 37. In this case, FIG. 18 shows the shaper 38 as seen from the direction of the front surface thereof and FIG. 19 shows the shaper 38 as seen from the direction of a side surface thereof.

Figure 20:
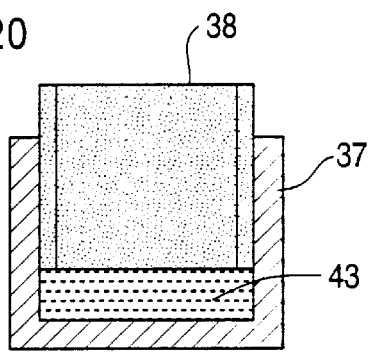
FIG. 20 shows the raw crystal material in a molten state.
Figure 21:
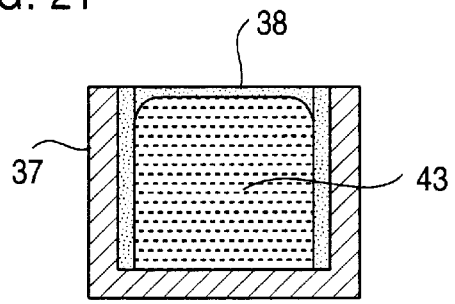
FIG. 21 shows a state in which the melt has been injected into the gaps within the shaper.
Figure 22:
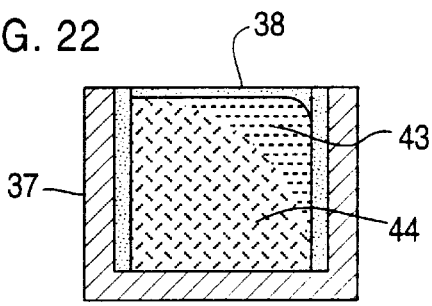
FIG. 22 shows a state in which the melt is solidifying from a lower left side of the shaper.
Figure 23:
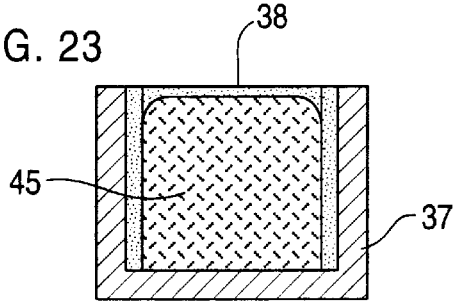
FIG. 23 shows a state in which the temperature of the crystal has fallen.

When the raw material has melted to form a melt 43, as shown in FIG. 20, a force F is applied to the pressuring member 39 of FIG. 14 to move it in the direction of the shaper 38. As a result, the melt 43 is injected into the gaps formed within the shaper 38. The melt 43 is gradually solidified from below by gradually lowering the temperature of the heater 35. A state in which a crystal 44 is formed by solidification from the lower left-hand side is shown in FIG. 22. Similarly, a state in which a crystal 45 is formed by solidification of the entire melt is shown in FIG. 23.

Figure 24:
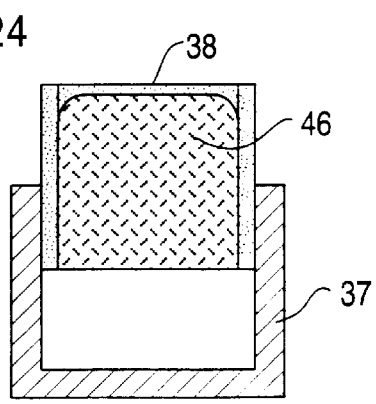
FIG. 24 shows the shaper being removed from the shaping vessel.
Figure 25:
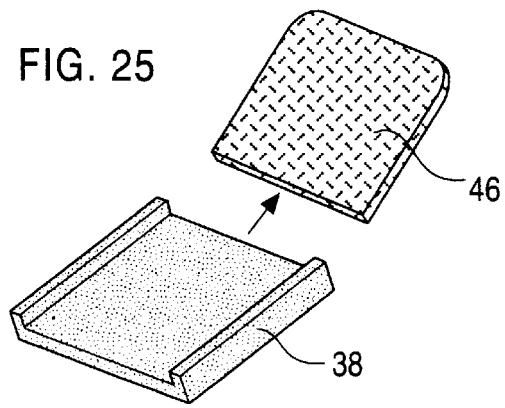
FIG. 25 shows a sheet crystal being removed from the shaper.

When the entire melt has solidified and cooled to room temperature, as shown in FIG. 24, the shaper 38 is removed from the shaping vessel 38 and plate crystals 46 are removed from the shaper 38, as shown in FIG. 25. A large number of sheet crystals can be obtained simultaneously because a large number (e.g. 150) of shapers are disposed within the shaping vessel 37, as previously mentioned.

Third Embodiment

Essential components of a third embodiment of this invention are shown in FIG. 26. This embodiment expands on the second embodiment to provide a configuration that can be applied to mass production. Portions that are equivalent to those of the second embodiment are denoted by the same reference numbers.

In this embodiment, the configuration is such that a large number (7, in this figure) of shaping vessels 37 move along graphite rails 50 at a low speed (in this case: 300 mm/H) from right to left. To enable this, a linear shaft is driven by a motor, not shown in the figure, so that the shaping vessel at the right-hand end is pushed at a low speed by this linear shaft. Although this is not shown in the figure either, a mechanism is provided to load the shaping vessels 37 one at a time onto a right-hand end portion of the rails and remove these shaping vessels 37 one at a time from a left-hand end portion of the rails 50. The heater 35 is disposed around the path along which the shaping vessels 37 move (but is shown only thereabove in the figure).

Raw crystal material 42 is contained in the base portion of the shaping vessel 37 at the right-hand end. The raw crystal material 42 is subjected to strong heating from the heater 35 as it moves along the rails 50 from right to left and, when it passes its melting point, it becomes the melt 43. The shaper 38 is pressed downward by the pressuring member 39 at substantially the center of the movement path thereof, so that the melt 43 is injected into the gaps formed in the shaper 38. The melt 43 injected into the gaps of the shaper 38 are subjected to weaker heating as it moves away from the center of the movement path, and gradually solidifies from the lower left-hand side to form the crystal 44. A low-temperature crystal 45 is further formed as the movement continues to the left. If it is assumed that the width of the shaping vessels 37 in FIG. 26 is 150 mm and the operation speed is 300 mm/H, and if 150 shapers 38 are provided within each shaping vessel 37, the pressuring member 39 presses the shaper 38 at a rate of twice per hour. In this case, the number of sheet crystals that can be fabricated in one day is: 150×2×20=6000 crystals.

It should be noted that, although the above described embodiments were described with reference to bismuth/tellurium compound semiconductor crystals and germanium crystals, the present invention can also be applied to the fabrication of semiconductor crystals such as silicon crystals and gallium/antimony crystals, fluoride crystals, oxide crystals, or metal crystals. Similarly, the description of the above embodiment related to the fabrication of needle or sheet crystals, the present invention can be applied to the fabrication of other shapes of crystal, by changing the form of the shaper.

INDUSTRIAL APPLICABILITY

The method of fabricating a shaped crystal in accordance with this invention is useful for fabricating various kinds of crystals such as bismuth/tellurium compound thermoelectric semiconductor crystals, silicon crystals, or germanium crystals, and is particularly suitable for the fabrication of a large number of highly functional monocrystals in batches.

I claim:

1. A method of fabricating a shaped crystal, comprising:

a step of heating a raw crystal material within a shaping vessel to form a melt;

a step of pressuring the melt from overhead, so as to inject the melt into a shaper disposed within said shaping vessel; and a step of cooling melt injected into said shaper, to form a crystal.

2. The method of fabricating a shaped crystal by overhead-pressure liquid injection of claim 1, wherein the melt is injected into the shaper from above the shaper.

3. The method of fabricating a shaped crystal by overhead-pressure liquid injection of claim 1, wherein the melt is injected into the shaper from below the shaper.

4. The method of fabricating a shaped crystal by overhead-pressure liquid injection of claim 1, further including means for pressuring said melt by using a set gas pressure.

5. The method of fabricating a shaped crystal by overhead-pressure liquid injection of claim 1, wherein the shaping vessel has a box shape and defines a plurality of conical holes in the base of the interior thereof for controlling the orientation of crystals.

6. The method of fabricating a shaped crystal by overhead-pressure liquid injection of claim 5, wherein the shaper is configured of a plurality of plate members, each having grooves in the vertical direction and being linked together in such a manner that said grooves are opposing.

7. The method of fabricating a shaped crystal by overhead-pressure liquid injection of claim 1, wherein the shaper is configured of a linked series of a plurality of plate members formed to have steps along left and right edges thereof.

8. The method of fabricating a shaped crystal by overhead-pressure liquid injection of claim 1, wherein the raw crystal material is heated in a vacuum within the shaping vessel.

9. The method of fabricating a shaped crystal by overhead-pressure liquid injection of claim 1, wherein the raw crystal material is heated in an inert atmosphere within the shaping vessel.

* * * * *